(12) United States Patent
Lee et al.

(10) Patent No.: US 7,205,810 B1
(45) Date of Patent: Apr. 17, 2007

(54) SKEW TOLERANT PHASE SHIFT DRIVER WITH CONTROLLED RESET PULSE WIDTH

(75) Inventors: Jungyong Lee, San Jose, CA (US); Heechoul Park, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 7 days.

(21) Appl. No.: 11/239,264

(22) Filed: Sep. 29, 2005

(51) Int. Cl.
*H03H 11/16* (2006.01)

(52) U.S. Cl. ...................... 327/231; 327/243

(58) Field of Classification Search ............. 327/231, 327/232, 233, 237, 238, 239, 240, 243
See application file for complete search history.

(56) References Cited

U.S. PATENT DOCUMENTS

| | | | |
|---|---|---|---|
| 5,661,675 A | 8/1997 | Chin et al. | 708/670 |
| 5,796,282 A | 8/1998 | Sprague et al. | 327/210 |
| 6,104,213 A | 8/2000 | Dhong et al. | 326/98 |
| 6,275,071 B1 | 8/2001 | Ye et al. | 326/98 |
| 6,316,960 B2 | 11/2001 | Ye | 326/95 |
| 6,924,684 B1 * | 8/2005 | Nguyen | 327/241 |
| 2001/0015657 A1 | 8/2001 | Ye | 326/98 |

* cited by examiner

*Primary Examiner*—Linh My Nguyen
(74) *Attorney, Agent, or Firm*—Meyertons Hood Kivlin Kowert & Goetzel, P.C.; B. Noël Kivlin; Mario J. Lewin

(57) ABSTRACT

A phase shift driver for phase shifting an input clock signal at a first phase to generate an output signal at a second phase without missing subsequent input signals. Input logic circuitry of the phase shift driver may receive an input signal at a first phase. Output logic circuitry of the phase shift driver may generate an output signal at a second phase relative to the input signal. The output signal may be a phase-shifted version of the input signal. A reset control circuit may receive a feedback signal from the output logic circuitry and an intermediate signal from the input logic circuitry and generate a reset signal based on the received feedback and intermediate signals. The reset control circuit may control a pulse width of the reset signal to reset the input logic circuitry within a period of time before the input logic circuitry receives a subsequent input signal.

20 Claims, 2 Drawing Sheets

SKEW TOLERANT PHASE SHIFT DRIVER WITH CONTROLLED RESET PULSE WIDTH

BACKGROUND OF THE INVENTION

1. Field of the Invention

This invention relates to integrated circuits and, more particularly, to phase shift drivers.

2. Description of the Related Art

In the semiconductor industry, the demand for higher performing devices has resulted in devices that operate at increasingly higher clock frequencies. As the operational frequencies of devices increase, cycle times are getting smaller. Even though the frequencies and cycle times are changing, the signal skew associated with the operation of these devices may remain the same. If the signal skew is staying relatively constant and the cycle times are being reduced, the skew portion in an operational cycle time may be increasing.

Semiconductor devices may include phase shift drivers used for phase shifting signals. A phase shift driver may receive an input signal at a first phase and generate an output signal at a second phase relative to the input signal. During normal operation of a typical phase shift driver, the expected input signal at a first phase may arrive before a rising edge of the corresponding clock signal due to the relatively large signal skew. As a result, the phase shift driver may generate unwanted output signals. Additionally, the pulse width of the input signal may be much narrower than expected due to the signal skew. In this case, the phase shift driver may fail to generate the expected output signals. Furthermore, after receiving a first input signal, the phase shift driver may be reset to receive a subsequent input signal. In some cases, the reset period may be too long, which may cause the phase shift driver to miss the subsequent input signal and thus fail to generate an output.

SUMMARY OF THE INVENTION

Various embodiments are disclosed of a phase shift circuit for phase shifting an input signal at a first phase to generate an output signal at a second phase. The phase shift circuit may include a reset control circuit to prevent the missing of subsequent input signals during a reset period.

In one embodiment, input logic circuitry of the phase shift driver may receive an input signal at a first phase. Output logic circuitry of the phase shift driver may generate an output signal at a second phase relative to the input signal. The reset control circuit may receive a feedback signal from the output logic circuitry and an intermediate signal from the input logic circuitry and generate a reset signal based on the received feedback and intermediate signals. The reset control circuit may control a pulse width of the reset signal to reset the input logic circuitry within a period of time before the input logic circuitry receives a subsequent input signal. More specifically, the reset control circuit may enable the reset signal in response to receiving an enabled feedback signal and disable the reset signal in response to receiving a disabled intermediate signal. By controlling the pulse width of the reset signal, the reset control circuit may prevent the phase shift driver from receiving subsequent input signals during the reset period.

In one embodiment, the reset control circuit may control a pulse width of the reset signal to reset a latching circuit of the input logic circuitry within a period of time before an input terminal of the phase shift driver receives a subsequent input signal. The reset control circuit may enable the reset signal in response to receiving an enabled feedback signal. The reset signal may be enabled to reset the latching circuit, which may disable the intermediate signal provided to the output logic circuitry and the reset control circuit. In response to receiving the disabled intermediate signal, the reset control circuit may disable the reset signal.

Figure 1:
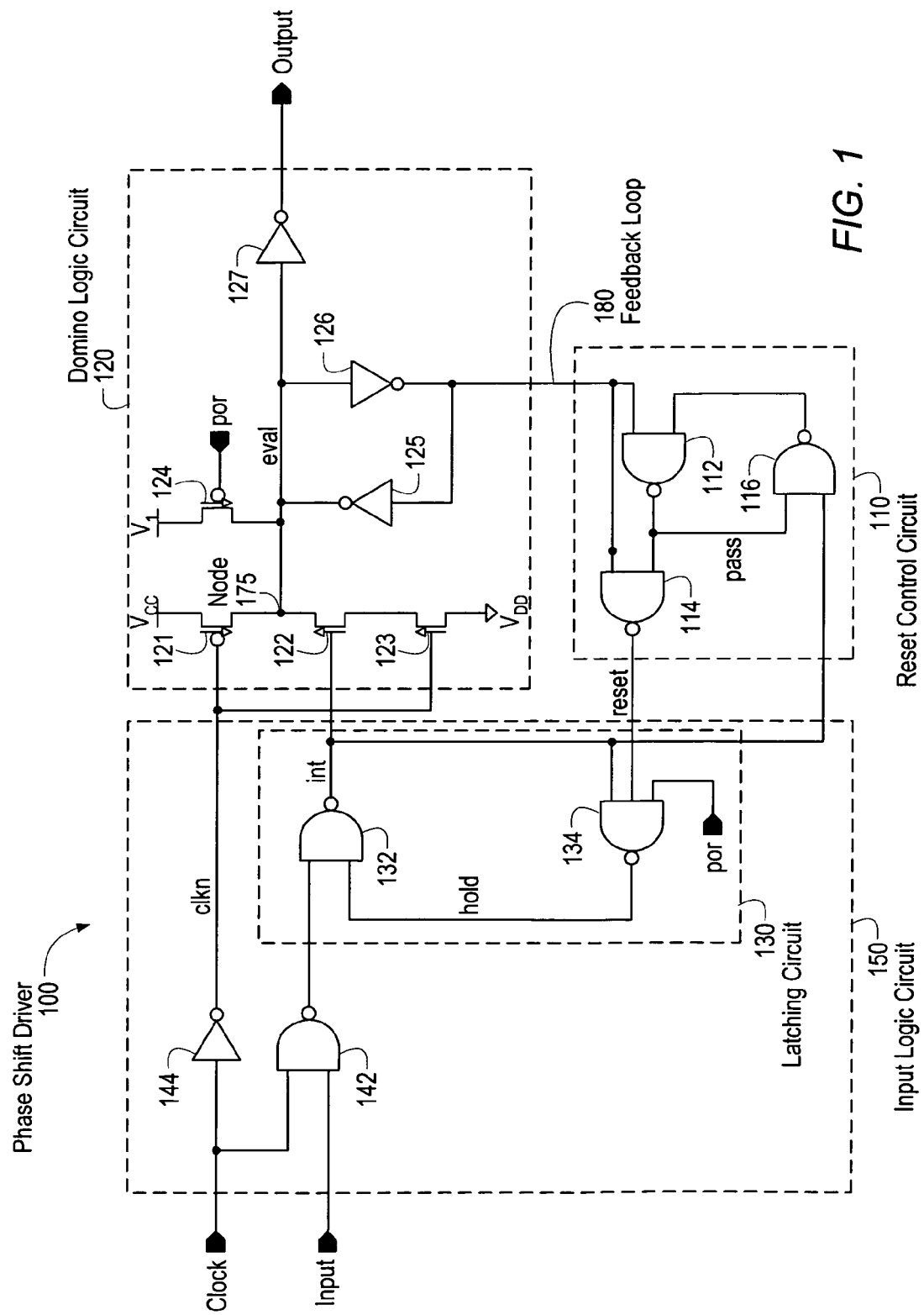
FIG. 1 is a diagram of one embodiment of a phase shift driver.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

Turning now to FIG. 1, a diagram of one embodiment of a phase shift driver 100 is shown. As illustrated in the embodiment of FIG. 1, phase shift driver 100 includes a reset control circuit 110, domino logic circuitry 120, and input logic circuitry 150. Phase shift driver 100 receives an input signal at a first phase and generates an output signal at a second phase relative to the input signal.

In one example, the input signal described above may be a control signal at a first phase that is associated with a data signal also at a first phase. At a certain point in time, the data signal may be manipulated in such a way that a delay is introduced into the data signal. After the delay, the data signal is now at a second phase relative to the control signal. If the data signal is delayed, the control signal at the first phase may be provided to phase shift driver 100 to generate the control signal at the second phase. Therefore, even if the data signal is delayed during processing, the phase shift driver 100 may phase shift the control signal such that its phase corresponds to that of the data signal. It is noted that in other embodiments the phase shift driver 100 may be provided to phase shift other types of signals, e.g., data signals.

In one embodiment, input logic circuitry 150 of phase shift driver 100 receives an input signal at a first phase. The output circuitry of phase shift driver 100, e.g., domino logic circuitry 120, generates an output signal at a second phase relative to the input signal. The output signal may be a phase-shifted version of the input signal. It is noted, however, that in other embodiments phase shift driver 100 may include other types of output circuitry for generating an output signal at a second phase relative to the input signal.

Reset control circuit 110 receives a feedback signal from domino logic circuitry 120 via feedback loop 180 and an intermediate (int) signal from input logic circuitry 150 and generates a reset signal based on the feedback and intermediate signals. Reset control circuit 110 controls the pulse width of the reset signal to reset input logic circuitry 150 within a period of time before input logic circuitry 150 receives a subsequent input signal. Reset control circuit 110 may prevent phase shift driver 100 from missing a subsequent input signal by limiting the period of time phase shift driver 100 stays in a reset mode, as will be further described below with reference to FIGS. 2 and 3.

In one specific implementation, the reset control circuit 110, domino logic circuitry 120, and input logic circuitry 150 may be formed as shown in the embodiment of FIG. 1. In the depicted embodiment of FIG. 1, reset control circuit 110 includes NAND gates 112, 114, and 116. The output terminal of NAND gate 112 is connected to the first input terminal of NAND gate 114 and the first input terminal of NAND gate 116 to provide a pass signal. Feedback loop 180 is connected to the first input terminal of NAND gate 112 and the second input terminal of NAND gate 114 to provide the feedback signal. The second input terminal of NAND gate 112 is coupled to the output terminal of NAND gate 116. The input logic circuitry 150 is coupled to the second input terminal of NAND gate 116. The output terminal of NAND gate 114 is connected to the input logic circuitry 150 to provide a reset signal.

As illustrated in the embodiment of FIG. 1, domino logic circuitry 120 includes p-type FET 121, n-type FET 122, and n-type FET 123 coupled in series between a high voltage potential $V_{CC}$ and a low voltage potential $V_{DD}$. The drain terminal of p-type FET 121 is connected to $V_{CC}$, and the source terminal of p-type FET 121 is connected to the drain terminal of n-type FET 122. The source terminal of n-type FET 122 is connected to the drain terminal of n-type FET 123, and the source terminal of n-type FET 123 is connected to $V_{DD}$. Domino logic circuitry 120 further includes p-type FET 124, inverter 125, inverter 126, and inverter 127. Node 175 is connected between the source terminal of p-type FET 121 and the drain terminal of p-type FET 121. The node 175 is connected to the source terminal of p-type FET 124, the input terminal of the inverter 127, the input terminal of inverter 126, and the output terminal of the inverter 125. An evaluation (eval) signal is provided to the input terminal of the inverter 127 and the input terminal of inverter 126 via node 175. The drain terminal of p-type FET 124 is coupled to a high voltage potential $V_1$. The output terminal of the inverter 126 is coupled to the input terminal of inverter 125. The output terminal of inverter 127 is coupled to the output terminal of the domino logic circuitry 120, which corresponds to the output terminal of the phase shift driver 100, to provide an output signal.

In the illustrated embodiment of FIG. 1, input logic circuitry 150 includes inverter 144, NAND gate 142, and a latching circuit 130. The input terminal of inverter 144 is connected to the clock terminal of phase shift circuit 100 to receive a clock signal. The first input terminal of NAND gate 142 is also connected to the clock terminal of phase shift circuit 100, and the second input terminal of NAND gate 142 is connected to the input terminal of phase shift circuit 100 to receiving an input signal. The output terminal of inverter 144 is connected to the gate terminal of FET 121 and the gate terminal of FET 123 of domino logic circuitry 120 to provide an inverted clock (clkn) signal. The output terminal of NAND gate 142 is connected to latching circuit 130.

In one specific implementation, latching circuit 130 may be formed as shown in the embodiment of FIG. 1. In the depicted embodiment of FIG. 1, latching circuit 130 includes NAND gate 132 and NAND gate 134. The first input terminal of NAND gate 132 is connected to the output terminal of NAND gate 134. The output terminal of NAND gate 134 is connected to the second input terminal of NAND gate 132. The output terminal of NAND gate 132 is connected to the first input terminal of NAND gate 134, the second input terminal of NAND gate 116 of the reset control circuit 110, and the gate terminal of FET 122 of domino logic circuitry 120 to provide the intermediate (int) signal. The second input terminal of NAND gate 134 is connected to the output terminal of NAND gate 114 of the reset control circuit 110. Phase shift driver 100 may include latching circuit 130 to guarantee overlap in the 'clkn' and 'int' signals, which may allow domino logic circuitry 120 of phase shift driver 100 to enter an evaluation phase, as will be described further below with reference to FIG. 2.

It should be noted that the components described with reference to FIG. 1 are meant to be exemplary only, and are not intended to limit the invention to any specific set of components or configurations. For example, in various embodiments, one or more of the components described may be omitted, combined, modified, or additional components included, as desired. For instance, in some embodiments, the design of domino logic circuitry 120 and latching circuit 130 may vary.

Figure 2:
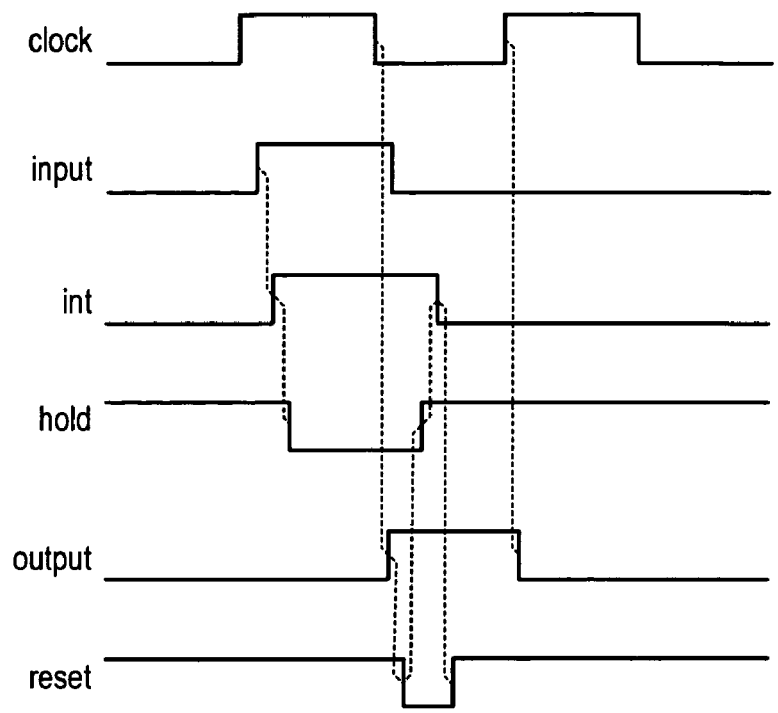
FIG. 2 is a timing diagram illustrating the operation of the phase shift driver, according to one embodiment.

FIG. 2 is a timing diagram illustrating the operation of phase shift driver 100, according to one embodiment. Referring collectively to FIG. 2 and FIG. 1, during operation, phase shift driver 100 may receive a clock signal and an input signal at a first phase as inputs. The clock signal may serve as a reference signal to phase shift the input signal. As described above, the phase shift driver 100 may generate an output signal at a second phase relative to the input signal.

As illustrated in the embodiment of FIG. 2, when the clock signal is high and the input signal is high, NAND gate 142 provides a low signal to one of the input terminals of NAND gate 132 of latching circuit 130. As a result, NAND gate 132 provides a high intermediate (int) signal to FET 122 of domino logic circuitry 120, to one of the input terminals of NAND gate 134, and to one of the input terminals of NAND gate 116 of the reset control circuit 110. Also, when the clock signal is high, inverter 144 provides a low signal to FETs 121 and 123 of domino logic circuitry 120. In this case, FET 121 is on, FET 122 is on, and FET 123 is off; therefore, node 175 is pre-charged to the high voltage potential $V_{CC}$ through FET 121. FET 124 may be off because the power-on-reset (por) signal is typically high. When circuit operation begins, the 'por' signal may be initially low and then it may be high the rest of the time. The 'por' signal may be low initially to set the initial conditions in the phase shift driver 100.

When node 175 is pre-charged, the evaluation (eval) signal is high and therefore the output signal of the phase shift driver 100 is low, as illustrated in the timing diagram of FIG. 2. A low feedback signal is also provided to the feedback loop 180 and subsequently to the reset control circuit 110 via the inverter 126. In one embodiment, the feedback signal may correspond to the output signal of phase shift driver 100. In some embodiments, the output signal at the output of inverter 127 may be provided to feedback loop 180 to serve as the feedback signal, in addition to being provided to the output terminal of phase shift driver 100. The low feedback signal is then provided to NAND gates 112 and 114. In response to the low feedback signal, NAND gate 114 outputs a high reset signal and NAND gate 112 outputs a high pass signal. The high reset signal is provided to NAND gate 134 of latching circuit 130. In this case, NAND gate 134 receives a high 'int' signal, a high reset signal, and a high 'por' signal. Therefore, NAND gate 134 provides a low hold signal to NAND gate 132, which results in a high 'int' signal. This scenario continues until the clock signal goes low.

When the clock signal goes low, FET 121 is turned off, FET 122 stays on, and FET 123 is turned on. Since FET 122 and 123 are on, the node 175 is discharged to the low voltage potential $V_{DD}$. Therefore, as depicted in the timing diagram of FIG. 2, the 'eval' signal is low and the output signal of the phase shift driver 100 is high. In this case, NAND gates 112 and 114 of reset control circuit 110 receive a high feedback signal. NAND gate 116 receives a high 'int' signal and a high pass signal; therefore, NAND gate 116 provides a low signal to the other input terminal of NAND gate 112. As a result, NAND gate 112 generates a high pass signal. Since NAND gate 114 receives a high pass signal and a high feedback signal, NAND gate 114 provides a low reset signal to latching circuit 130. The low reset signal resets latching circuit 130 by causing NAND gate 134 to generate a low hold signal, which in turn causes NAND gate 132 to generate a low 'int' signal. In sum, the low reset signal resets latching circuit 130 by changing the state of the 'int' signal from high to low.

After latching circuit 130 is reset, FET 122 is turned off, which stops the discharging of node 175. However, inverters 125 and 126 maintain the 'eval' signal low until FET 121 is turned on by the next transition of the clock signal. Since the output signal is still high (which also means the feedback signal is still high) and the 'int' signal is now low, the reset signal generated by the reset control circuit 110 transitions to a high state. More specifically, the low 'int' signal causes NAND gate 116 to provide a high signal to NAND gate 112. The NAND gate 112 generates a low pass signal, which causes NAND gate 114 to generate a high reset signal. Since the 'int' signal is tied to NAND gate 116, reset control circuit 110 responds to the low 'int' signal by changing the state of the reset signal back to a high state, which results in a relatively short reset period. In this way, the pulse width of the reset signal is controlled so that phase shift driver 100 does not miss a subsequent input signal.

It is noted that both the feedback signal and the 'int' signal may determine the state of the reset signal. The reset signal may change to a low state (i.e., enabled) in response to the reset control circuit 110 receiving a high feedback signal and a high 'int' signal. The reset signal may change to a high state (i.e., disabled) in response to the reset control circuit 110 receiving a low 'int' signal. When reset control circuit 110 receives a low 'int' signal, the reset signal may change to a high whether the feedback signal is high or low. Therefore, besides turning FET 122 on and off, the 'int' signal helps control the pulse width of the reset signal.

Note that when the input signal and the clock signal go low, the 'int' signal may stay high for a period of time until the 'eval' signal goes low. Domino logic circuitry 120 of phase shift driver 100 may enter an evaluation stage during this period of time when the 'clkn' and 'int' signals are high. Latching circuit 130 guarantees this overlap between the 'clkn' and 'int' signals, which may allow domino logic circuitry 120 to enter the evaluation stage. The evaluation stage is the period of time when the pull-down transistors, FETs 122 and 123, are on and discharging node 175 (i.e., 'eval' signal) to the low voltage potential $V_{DD}$.

As illustrated in the timing diagram of FIG. 2, when the reset and hold signals are high and the input signal goes high, it causes the 'int' signal to go high and the hold signal to go low. From this point, the 'int' signal will stay high regardless of the state of the input signal and will not go low until the 'eval' signal goes low. More specifically, when the 'int' signal is high (i.e., FET 122 is on) and the clock signal goes low, the 'clkn' signal will be high, which turns on FET 123. The domino logic circuitry 120 enters the evaluation stage and the FETs 122 and 123 discharge node 175, which results in the 'eval' signal going low. The 'eval' signal is then fed back via feedback loop 180 to reset control circuit 110. The reset control circuit 110 generates a low reset signal, which causes the hold signal to go high, and in turn results in the 'int' signal going low. Thus, after the input signal is received at the phase shift driver 100, the 'int' signal will stay high until the 'eval' signal goes low (which causes the reset signal to go low), thereby guaranteeing overlap between the 'clkn' and 'int' signals.

In one embodiment, inverters 125 and 126 may form a keeper circuit to maintain node 175 at either a high or low level. The keeper circuit may supply the charge necessary to compensate for the loss of charge due to various leakage paths, as well as loss of charge due to capacitive coupling of node 175 to other signal paths. In another embodiment, domino logic circuitry 120 may instead include a half-keeper circuit to maintain node 175 at only one level, e.g., only a high level.

Figure 3:
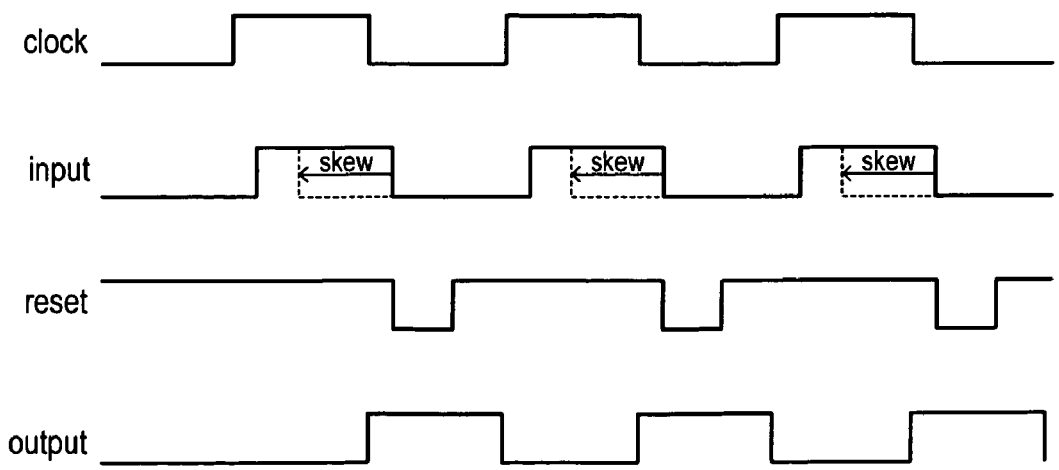
FIG. 3 is another timing diagram illustrating three complete cycles during normal operation of the phase shift driver, according to one embodiment.

FIG. 3 is another timing diagram illustrating three complete cycles during normal operation of phase shift driver 100, according to one embodiment. During operation, note that phase shift driver 100 receives an input signal at a first phase and generates an output signal at a second phase relative to the input signal. Even though the input signal may have considerable skew, the 'int' signal may not be affected by the falling edge of the input signal. More specifically, with reference to the embodiment of FIG. 1, when the input signal goes low (e.g., due to signal skew), NAND gate 132 receives the low input signal. However, since the hold signal of the latching circuit 130 remains in a low state, NAND gate 132 continues to generate a high 'int' signal. The input signal skew may not affect the state of the 'int' signal, and therefore may not affect the output signal. In addition, phase shift driver 100 may include NAND gate 142 to help prevent skew in the rising edge of the input signal, which may cause unwanted output signals.

As illustrated in the embodiment of FIG. 3, reset control circuit 110 may control the pulse width of the reset signal so that the reset period (i.e., when the reset signal is in a low state) is relatively short. This may prevent phase shift driver 100 from receiving input signals during the reset period. In other words, by controlling the pulse width of the reset signal, phase shift driver 100 may detect the rising edges of all the input signals and may prevent any missed output signals.

The phase shift driver 100 may be an integrated circuit (IC), e.g., a digital IC. Phase shift driver 100 may be implemented in any device needing to phase-shift an input signal at a first phase to generate an output signal at a second phase, e.g., a microprocessor, a memory, a receiver, a transmitter, a DMA controller, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A phase shift circuit comprising:
input logic circuitry configured to receive an input signal at a first phase;
output logic circuitry coupled to the input logic circuitry and configured to generate an output signal at a second phase relative to the input signal, wherein the output signal is a phase-shifted version of the input signal; and
a reset control circuit configured to receive a feedback signal from the output logic circuitry and an intermediate signal from the input logic circuitry, wherein the reset control circuit is further configured to generate a reset signal based on the received feedback and intermediate signals, wherein the reset control circuit is configured to control a pulse width of the reset signal to reset the input logic circuitry within a period of time before the input logic circuitry receives a subsequent input signal.

2. The phase shift circuit of claim 1, wherein, in controlling the pulse width of the reset signal, the reset control circuit is configured to enable the reset signal in response to receiving an enabled feedback signal and disable the reset signal in response to receiving a disabled intermediate signal.

3. The phase shift circuit of claim 1, wherein the reset control circuit is configured to control the pulse width of the reset signal to prevent the phase shift circuit from receiving a subsequent input signal during a reset period.

4. The phase shift circuit of claim 1, further comprising a feedback loop coupled between the output logic circuitry and the input logic circuitry, wherein the reset control circuit is coupled to the feedback loop to receive the feedback signal and generate the reset signal.

5. The phase shift circuit of claim 1, wherein the reset control circuit includes a first NAND gate, a second NAND gate, and a third NAND gate, wherein an output terminal of the first NAND gate is coupled to a first input terminal of the second NAND gate and a first input terminal of the third NAND gate, wherein the output logic circuitry is coupled to a first input terminal of the first NAND gate and a second input terminal of the second NAND gate, wherein a second input terminal of the first NAND gate is coupled to an output terminal of the third NAND gate, wherein the input logic circuitry is coupled to a second input terminal of the third NAND gate, and wherein an output terminal of the second NAND gate is coupled to the input logic circuitry.

6. The phase shift circuit of claim 5, wherein the output logic circuitry includes a first p-type transistor, a first n-type transistor, and a second n-type transistor coupled in series, wherein a drain terminal of the first p-type transistor is coupled to a first high voltage potential, wherein a source terminal of the first p-type transistor is coupled to a drain terminal of the first n-type transistor, wherein a source terminal of the first n-type transistor is coupled to a drain terminal of the second n-type transistor, wherein a source terminal of the second n-type transistor is coupled to a low voltage potential.

7. The phase shift circuit of claim 6, wherein the output logic circuitry further includes a second p-type transistor, a second inverter, a third inverter, and a fourth inverter, wherein a node coupled between the source terminal of the first p-type transistor and the drain terminal of the first n-type transistor is coupled to a source terminal of the second p-type transistor, an input terminal of the second inverter, an input terminal of the third inverter, and an output terminal of the fourth inverter, wherein the drain terminal of the second p-type transistor is coupled to a second high voltage potential, wherein an output terminal of the third inverter is coupled to an input terminal of the fourth inverter, wherein an output terminal of the second inverter is coupled to an output terminal of the phase shift circuit.

8. The phase shift circuit of claim 6, wherein the input logic circuitry includes a first inverter, a fourth NAND gate, and a latching circuit, wherein an input terminal of the first inverter is coupled to a clock terminal of the phase shift circuit, wherein a first input terminal of the fourth NAND gate is coupled to the clock terminal of the phase shift circuit, wherein a second input terminal of the fourth NAND gate is coupled to an input terminal of the phase shift circuit, wherein an output terminal of the first inverter is coupled to a gate terminal of the first p-type transistor and a gate terminal of the second n-type transistor of the output logic circuitry, and an output terminal of the fourth NAND gate is coupled to the latching circuit.

9. The phase shift circuit of claim 8, wherein the latching circuit includes a fifth NAND gate and a sixth NAND gate, wherein a first input terminal of the fifth NAND gate is coupled to the output terminal of the fourth NAND gate, wherein an output terminal of the sixth NAND gate is coupled to a second input terminal of the fifth NAND gate, wherein an output terminal of the fifth NAND gate is coupled to a first input terminal of the sixth NAND gate, the second input terminal of the third NAND gate of the reset control circuit, and a gate terminal of the first n-type transistor of the output logic circuitry, wherein a second input terminal of the sixth NAND gate is coupled to the output terminal of the second NAND gate of the reset control circuit.

10. The phase shift circuit of claim 9, wherein the output terminal of the third inverter of the output logic circuitry is coupled to the first input terminal of the first NAND gate and the second input terminal of the second NAND gate of the reset control circuit.

11. The phase shift circuit of claim 9, wherein the reset control circuit is configured to control the pulse width of the reset signal to reset the latching circuit within a period of time before the fourth NAND gate receives a subsequent input signal.

12. The phase shift circuit of claim 11, wherein, in controlling the pulse width of the reset signal to reset the latching circuit within a period of time before the fourth NAND gate receives a subsequent input signal, the reset control circuit is configured to enable the reset signal in response to receiving an enabled feedback signal, wherein the reset signal is enabled to reset the latching circuit to disable an intermediate signal provided to the output logic circuitry and the reset control circuit, wherein the reset control circuit is configured to disable the reset signal in response to receiving the disabled intermediate signal.

13. A phase shift circuit comprising:
input logic circuitry configured to receive an input signal at a first phase;
output logic circuitry coupled to the input logic circuitry and configured to generate an output signal at a second phase relative to the input signal, wherein the output signal is a phase-shifted version of the input signal; and
a reset control circuit configured to receive a feedback signal from the output logic circuitry and an intermediate signal from the input logic circuitry and generate a reset signal based on the received feedback and intermediate signals;

wherein the reset control circuit includes a first NAND gate, a second NAND gate, and a third NAND gate, wherein an output terminal of the first NAND gate is coupled to a first input terminal of the second NAND gate and a first input terminal of the third NAND gate, wherein the output logic circuitry is coupled to a first input terminal of the first NAND gate and a second input terminal of the second NAND gate, wherein a second input terminal of the first NAND gate is coupled to an output terminal of the third NAND gate, wherein the input logic circuitry is coupled to a second input terminal of the third NAND gate, and wherein an output terminal of the second NAND gate is coupled to the input logic circuitry.

14. The phase shift circuit of claim 13, wherein the output logic circuitry includes a first p-type transistor, a first n-type transistor, and a second n-type transistor coupled in series, wherein a drain terminal of the first p-type transistor is coupled to a first high voltage potential, wherein a source terminal of the first p-type transistor is coupled to a drain terminal of the first n-type transistor, wherein a source terminal of the first n-type transistor is coupled to a drain terminal of the second n-type transistor, wherein a source terminal of the second n-type transistor is coupled to a low voltage potential.

15. The phase shift circuit of claim 14, wherein the output logic circuitry further includes a second p-type transistor, a second inverter, a third inverter, and a fourth inverter, wherein a node coupled between the source terminal of the first p-type transistor and the drain terminal of the first n-type transistor is coupled to a source terminal of the second p-type transistor, an input terminal of the second inverter, an input terminal of the third inverter, and an output terminal of the fourth inverter, wherein the drain terminal of the second p-type transistor is coupled to a second high voltage potential, wherein an output terminal of the third inverter is coupled to an input terminal of the fourth inverter, wherein an output terminal of the second inverter is coupled to an output terminal of the phase shift circuit.

16. The phase shift circuit of claim 15, wherein the input logic circuitry includes a first inverter, a fourth NAND gate, and a latching circuit, wherein an input terminal of the first inverter is coupled to a clock terminal of the phase shift circuit, wherein a first input terminal of the fourth NAND gate is coupled to the clock terminal of the phase shift circuit, wherein a second input terminal of the fourth NAND gate is coupled to an input terminal of the phase shift circuit, wherein an output terminal of the first inverter is coupled to a gate terminal of the first p-type transistor and a gate terminal of the second n-type transistor of the output logic circuitry, and an output terminal of the fourth NAND gate is coupled to the latching circuit.

17. The phase shift circuit of claim 16, wherein the latching circuit includes a fifth NAND gate and a sixth NAND gate, wherein a first input terminal of the fifth NAND gate is coupled to the output terminal of the fourth NAND gate, wherein an output terminal of the sixth NAND gate is coupled to a second input terminal of the fifth NAND gate, wherein an output terminal of the fifth NAND gate is coupled to a first input terminal of the sixth NAND gate, the second input terminal of the third NAND gate of the reset control circuit, and a gate terminal of the first n-type transistor of the output logic circuitry, wherein a second input terminal of the sixth NAND gate is coupled to the output terminal of the second NAND gate of the reset control circuit.

18. The phase shift circuit of claim 17, wherein the reset control circuit is configured to control the pulse width of the reset signal to reset the latching circuit within a period of time before the fourth NAND gate receives a subsequent input signal.

19. The phase shift circuit of claim 18, wherein, in controlling the pulse width of the reset signal to reset the latching circuit within a period of time before the fourth NAND gate receives a subsequent input signal, the reset control circuit is configured to enable the reset signal in response to receiving an enabled feedback signal, wherein the reset signal is enabled to reset the latching circuit to disable an intermediate signal provided to the output logic circuitry and the reset control circuit, wherein the reset control circuit is configured to disable the reset signal in response to receiving the disabled intermediate signal.

20. A method for phase shifting an input signal at a first phase to generate an output signal at a second phase, the method comprising:
   input logic circuitry receiving the input signal at the first phase;
   output logic circuitry generating the output signal at the second phase relative to the input signal, wherein the output signal is a phase-shifted version of the input signal;
   a reset control circuit receiving a feedback signal from the output logic circuitry and an intermediate signal from the input logic circuitry;
   the reset control circuit generating a reset signal based on the received feedback and intermediate signals; and
   the reset control circuit controlling a pulse width of the reset signal to reset the input logic circuitry within a period of time before the input logic circuitry receives a subsequent input signal.

* * * * *